(12) United States Patent
Aebersold et al.

(10) Patent No.: US 8,907,801 B2
(45) Date of Patent: Dec. 9, 2014

(54) DANGER DETECTOR FOR OPERATION IN NUCLEAR FIELD, HAVING HEATING SYSTEM FOR HEATING TYPICALLY NON-RADIATION HARDENED SEMICONDUCTOR COMPONENTS TO INCREASE FUNCTIONAL SERVICE LIFE

(71) Applicant: Siemens Aktiengesellschaft, Munich (DE)

(72) Inventors: Hans Aebersold, Bonstetten (CH); Martin Arnold, Muri (CH)

(73) Assignee: Siemens Aktiengesellschaft, Munich (DE)

( * ) Notice: Subject to any disclaimer, the term of this patent is extended or adjusted under 35 U.S.C. 154(b) by 16 days.

(21) Appl. No.: 13/677,092

(22) Filed: Nov. 14, 2012

(65) Prior Publication Data
US 2013/0120150 A1    May 16, 2013

(30) Foreign Application Priority Data

Nov. 15, 2011 (DE) .......................... 10 2011 086 424
Jan. 31, 2012 (EP) ..................................... 12153395

(51) Int. Cl.
| | | |
|---|---|---|
| G08B 17/10 | (2006.01) | |
| H01L 31/02 | (2006.01) | |
| G08B 21/18 | (2006.01) | |
| G08B 29/00 | (2006.01) | |
| H01L 27/02 | (2006.01) | |
| G08B 17/103 | (2006.01) | |
| G08B 17/107 | (2006.01) | |

(52) U.S. Cl.
CPC .............. *H01L 31/02* (2013.01); *G08B 21/182* (2013.01); *G08B 17/10* (2013.01); *G08B 29/00* (2013.01); *H01L 27/0248* (2013.01); *G08B 17/103* (2013.01); *G08B 17/107* (2013.01)
USPC ....... 340/630; 340/628; 340/634; 340/636.17

(58) Field of Classification Search
USPC .............................. 340/630, 628, 634, 636.17
See application file for complete search history.

(56) References Cited

U.S. PATENT DOCUMENTS

| | | |
|---|---|---|
| 3,922,656 A | 11/1975 | Horvath et al. |
| 3,992,940 A | 11/1976 | Platzer, Jr. |

(Continued)

FOREIGN PATENT DOCUMENTS

| | | |
|---|---|---|
| BY | 13703 | 10/2010 |
| CN | 1248034 | 3/2000 |

(Continued)

OTHER PUBLICATIONS

F. Saigné et al; "Experimental Procedure to Predict the Competition Between the Degradation Induced by Irradiation and Thermal Annealing of Oxide Trapped Charge in MOSFETs"; IEEE Transactions on Nuclear Science, vol. 47.; No. 6; Dec. 2000; pp. 2329-2333.
V. Danchenko et al.; "Activation Energies of Thermal Annealing of Radiation-Induced Damage in n- and p-Channels of CMOS Integrated Circuits"; IEEE Transactions on Nuclear Science, vol. NS-27, No. 6, Dec. 1980.; pp. 1658-1664.

(Continued)

*Primary Examiner* — Toan N Pham
(74) *Attorney, Agent, or Firm* — Staas & Halsey LLP

(57) ABSTRACT

A smoke detector or, more generally, a danger detector, operates in an area with increased radioactive radiation disposition danger detector has at least one detector unit for detecting at least one danger characteristic, a semiconductor component and other electrical components, at least for outputting an alarm signal. The danger detector also has a temperature control circuit. The temperature control circuit is configured to control the temperature of the at least one semiconductor component. The danger detector may be embodied as a linear smoke detector.

20 Claims, 5 Drawing Sheets

(56) References Cited

U.S. PATENT DOCUMENTS

| | | | |
|---|---|---|---|
| 4,585,932 | A | 4/1986 | Roberts et al. |
| 5,270,551 | A | 12/1993 | Kamimura et al. |
| 6,261,874 | B1 | 7/2001 | Francis et al. |
| 6,456,379 | B1 | 9/2002 | Kunz et al. |
| 6,737,977 | B2 | 5/2004 | Nishikawa et al. |
| 7,427,925 | B2 * | 9/2008 | Barrett et al. ............... 340/628 |
| 8,294,895 | B2 | 10/2012 | Kato |
| 2005/0110631 | A1 | 5/2005 | Siber et al. |
| 2013/0126508 | A1 * | 5/2013 | Salzman et al. ............ 219/209 |
| 2013/0277567 | A1 * | 10/2013 | Dardona et al. ............ 250/382 |

FOREIGN PATENT DOCUMENTS

| | | |
|---|---|---|
| CN | 1383107 | 12/2002 |
| CN | 101706987 | 5/2010 |
| CN | 101847306 | 9/2010 |
| DE | 10 2011 086 424.5 | 11/2011 |
| EP | 12153395 | 1/2012 |
| GB | 1321016 | 6/1973 |
| RU | 1464797 | 11/1995 |
| RU | 94013073 | 4/1996 |
| RU | 2137199 | 9/1999 |
| RU | 2242751 | 12/2004 |

OTHER PUBLICATIONS

F. Saigné et al.; "Prediction of the One-Year Thermal Annealing of Irradiated Commercial Devices Based on Experimental Isochronal Curves"; IEEE Transactions on Nuclear Science, vol. 47, No. 6, Dec. 2000; pp. 2244-2248.

H. Ohyama et al.; "Radiation source dependence of device performance degradation for 4H-SiC MESFETs"; Superlattices and Microstructures; vol. 40; 2006; pp. 632-637.

L. Dusseau et al.; "Prediction of low dose-rate effects in power metal oxide semiconductor field effect transistors nased on isochronal annealing measurements"; Journal of Applied Physics; vol. 81.; No. 5, Mar. 1997, pp. 2437-2441.

V. Danchenko et al.; "Activation Energies of Thermal Annealing of.Radiation-Induced Damage in n- and p-Channels of CMOS Integrated Circuits, Part II"; IEEE Transactions on Nuclear Science; vol. NS-28; No. 6; Dec. 1981; pp. 4407-4412.

E. Bendada et al.; "Annealing of Irradiated-Induced defects in power MOSFETs"; 2009 International Conf. on Microelectronics; pp. 236-239.

Russian Office Action issued Jun. 20, 2014 in corresponding Russian Patent Application No. 2012146551.

Chinese Office Action issued Jun. 26, 2014 in corresponding Chinese Patent Application No. 201210458785.8.

\* cited by examiner

DANGER DETECTOR FOR OPERATION IN NUCLEAR FIELD, HAVING HEATING SYSTEM FOR HEATING TYPICALLY NON-RADIATION HARDENED SEMICONDUCTOR COMPONENTS TO INCREASE FUNCTIONAL SERVICE LIFE

CROSS REFERENCE TO RELATED APPLICATIONS

This application is based on and hereby claims priority to German Application No. 10 2011 086 424.5 filed on Nov. 15, 2011 and European Application No. 12153395.4 filed on Jan. 31, 2012, both the contents of which are hereby incorporated by reference.

BACKGROUND

Described below is a danger detector, in particular a smoke detector, for operation in an area having an increased radioactive radiation disposition, with the danger detector having at least one detector unit for detecting at least one danger characteristic, a semiconductor component and other electrical components, at least for outputting an alarm signal.

Furthermore, the danger detector may be embodied as a linear smoke detector, having an opto-transmitter for emitting a light beam which traverses a measured distance, and having an opto-receiver for receiving the emitted light beam at the end of the measured distance.

The danger detector involves a smoke detector for example, such as an optical smoke detector or a thermal detector. Optical smoke detectors can be based on the scattered light principle or on the opto-acoustic principle, for example. If the danger detector is a thermal detector, then the temperature currently present in the surroundings of the thermal detector is detected, for instance by a temperature-dependent resistor. The danger detectors under consideration can also be flue gas detectors, which have a gas sensor as the detector unit, such as a gas FET (Field Effect Transistor) for example.

Furthermore, the danger detectors can involve motion detectors which have a PIR (passive infrared) detector unit for motion detection. The danger detectors under consideration can also have combinations of the afore-mentioned detector units.

Linear smoke detectors are based on the extinction principle. They are employed in particular in large or narrow spaces, for example in corridors, warehouses, factory buildings and in airplane hangars and are mounted below the ceiling on the walls. In a first embodiment, transmitter and receiver are located opposite each other and no reflector is required. In a second embodiment, the light beam emitted by the transmitter is deflected via a reflector back to the receiver. Transmitter and receiver adjoin each other. The measured distance of such types of linear smoke detectors is typically in the range from 20 m to 200 m, which in the case of the first embodiment corresponds to the equivalent distance between transmitter and receiver. In the second embodiment, the distance between transmitter/receiver and the reflector corresponds to half of the measured distance.

The area with increased, in particular with high radioactive radiation disposition, can be for example a nuclear area or in space. Nuclear areas are in particular spatially delimited areas within a nuclear power station, a nuclear reprocessing plant or a final or intermediate storage facility for radioactive waste, for example.

Radioactive radiation means ionizing particle or electromagnetic radiation which comes from radioactive materials and is able to tear off electrons from atoms and molecules, so that positively charged ions or molecule residues remain. Whereas alpha and beta radiation as particle radiation can even be screened by materials having a thickness of a few millimeters, effective screening against electromagnetic gamma radiation is only possible with a large amount of material. Depending on the screening requirement, lead shields with shield thicknesses of a meter or more can be required.

Radioactive radiation generally has a destructive effect on electronic components, particularly on semiconductor components. Such components have very fine semiconductor structure patterns of less than 1 µm, in particular less than 100 nm. In this case all types of high-energy, ionizing radiation interact with a semiconductor crystal. Even if screening against alpha and beta radiation is comparatively simple to achieve, for instance by a sheet metal enclosure or a plastic enclosure for example, then the action of the gamma radiation on the screening or on the housing of the semiconductor components results to some extent in secondary alpha and beta particles, which in turn interact with the semiconductor crystal. Due to the interaction of such an irradiated particle with a lattice atom, the latter can be released from the lattice structure and this produces a vacancy. If it has sufficient transferred impact energy, the free atom can knock out further atoms, or migrate to an intermediate lattice position. This forms a so-called intermediate lattice atom vacancy complex.

An important effect of the interacting radiation is the production of crystal defects which generate additional energy states within the forbidden band along with recombination centers. These effects are accelerated in highly complex semiconductor microstructures, such as ASICs or microcontrollers, for example. On the other hand, resistors or capacitors are very rarely affected.

For this reason, rugged, discrete semiconductor components such as transistors or diodes may be used to take into account accelerated degeneration of the electrical parameters in the circuit, especially as predominantly radiation-hardened, older integrated semiconductor components, such as ICs, logic gates, etc., which have a pattern size of more than 1 µm and due to the advances in miniaturization are in short supply in the semiconductor market.

Due to the use of discrete semiconductor components, a minimum service life, for example 3 years, which meets the relevant requirements, such as those of a nuclear power station, for example, can therefore be realized. Such a requirement can be, for example, that a smoke detector has to withstand a radiation exposure or an energy dose of 0.25 Gy over a period of 3 years. Here the term Gy (Gray) is the SI unit of the absorbed energy dose D. In this case the energy dose absorbed with respect to time is termed the dose rate.

In an unrelated field, a semiconductor laser for applications in space is known from Chinese Patent Application CN 101841125 A. To an undescribed extent and by undescribed means, the temperature of the semiconductor laser is increased in order to accelerate annealing of damage caused by radiation, typically by protons and electrons.

A detailed description of the effect of radioactive radiation on electronic semiconductors, in particular the associated accumulated or temporary damage over time of such semiconductor components, is described in the dissertation "Component degradation due to radioactive radiation and its consequences for the design of radiation-hardened electronic circuits" by Detlef Brumbi, Faculty of Electronic Engineering at Ruhr University, Bochum, 1990.

A mathematical model for a stress method for MOS semiconductors at a high radiation rate, which enables precise long-term forecasts to be made concerning the rate of formation of induced holes (positive charges) in the semiconductor material due to the effect of radioactive radiation, in particular in the semiconductor oxide employed as an electrical circuit insulator, such as $SiO_2$, for example, is proposed in the publication: IEEE Transactions on Nuclear Science, VOL. 37, NO. 6, DECEMBER 1990, titled "Modeling the anneal of radiation-induced trapped holes in a varying thermal environment", by P. J. McWhorter, S. L. Miller and W. M. Miller of Sandia National Laboratories, Albuquerque, N. Mex., USA, December 1990. Based on this determined rate of formation, reliable data are obtained on the long-term failure modes of the semiconductor under investigation with a comparable short test time and high radiation disposition.

The method described in the publication demonstrates a solution as to how the necessary cooling time, the so-called annealing, can be reduced. This time is necessary for the recombination of the induced holes following a high radiation disposition, to ultimately determine the influence of the radiation disposition on the reliability performance of the semiconductor according to the so-called MIL standard 883 TM 1019. In this connection, a temperature-dependent recombination process acting in opposition to the hole formation rate is described, whose formation rate likewise increases with increasing semiconductor temperature. The reason for this recombination is that the ions produced in the semiconductor oxide by radiation are unstable and therefore attempt to get back the missing electrons from their environment, whereby the original molecules or atoms are restored.

SUMMARY

Based on the related art described in the introduction, an aspect of the danger detector is use in an area with increased radioactive radiation disposition.

The danger detector has a temperature control circuit. The temperature control circuit is configured to control the temperature of the at least one semiconductor component.

Advantageously, as a result, the same semiconductor temperature is achieved irrespective of the mounting of the danger detector.

A fundamental idea is that by controlling the at least one semiconductor component, in particular a typically non-radiation hardened semiconductor component, to a predetermined operating temperature, the increased electrical hole conductivity induced by the radioactive radiation disposition in the semiconductor material, in particular in the semiconductor insulation material, such as silicon dioxide or silicon nitride, is now at least partially compensated by a hole recombination rate that is increased with increasing operating temperature. Advantageously, as a result, the switching threshold voltage that is critical for the proper operation of an electronic circuit remains within the specified permissible tolerance band for a longer period, in particular for a required minimum operating time such as three years for example.

Here, "non-radiation hardened semiconductor components" means semiconductor components which are not intended for use in the nuclear sector. These are semiconductor components typically intended for the consumer market or for military applications. A particular feature is that the aforementioned semiconductor components fail within a few months or just do not function at all when exposed to radiation or an energy dose of 0.25 Gy.

According to one embodiment, the temperature control circuit has, in particular, an electrical heating element for controlled heating of the at least one semiconductor component. Consequently, where the electrical heat dissipation of the non-radiation hardened semiconductor components and, if applicable the other electrical components, is insufficient to maintain the specified operating temperature range, heating-up and remaining in the required temperature range is advantageously possible. The electrical heating element may be an ohmic resistor. It can for example be realized as a conductive sheet-type heating element.

According to a special embodiment the at least one semiconductor component is a processor-backed microcontroller or processor. At least one computer program can be executed on the microcontroller, which is designed to control the electrical heat dissipation of the microcontroller and/or of at least one of the other semiconductor components which can be controlled by the microcontroller according to the detected temperature of the semiconductor component by way of a heating system.

This simplifies the outlay for a heating system. Rather, a separate heating element can be dispensed with. The increase in the power dissipation in the microcontroller itself can be achieved for example by memory copying actions or by executing mathematical functions by way of an increase in the CPU or processor utilization. Alternatively, where there is a need for cooling, the normal program flow can be changed over to a minimum function mode, with only the program operations that are absolutely necessary for the danger detector mode being executed.

At least one part of the temperature control circuit can also be realized as a computer program that can be executed on the microcontroller.

Furthermore, this considerably simplifies the technical outlay for a temperature control circuit. Such a temperature control circuit typically includes a temperature recording system for a temperature actual value, a comparator for comparing the recorded temperature actual value with a specified temperature setpoint value, a controller to which the determined comparison value is fed as an error deviation, and finally a downstream final controlling element for controlling the electrical heating element. The default temperature setpoint value can be stored electronically in a non-volatile memory of the microcontroller, for example.

The entire temperature control circuit may be integrated in the microcontroller, with the temperature sensor then likewise being integrated in the microcontroller. Only one part of the temperature control circuit, such as only the controller or the final controlling element, for example, can also be integrated in the microcontroller.

The temperature control program for the temperature control circuit and the computer program for controlling the power dissipation can also be a joint computer program. The at least one additional semiconductor component can be for example an electronic switch, such as a transistor for example, which is present anyway and by suitable triggering, such as by a high-frequency trigger circuit for example, heats up separately without affecting its actual switching function with regard to the downstream parts of the circuit.

The microcontroller can have, for example, a temperature input, an input for connecting a temperature sensor, such as an NTC, for example, or an already integrated temperature sensor for registering the ambient temperature. Furthermore, the microcontroller is configured for triggering a switching element, such as a transistor for example, or it already has a switching output so that the electrical heating element can be controlled. Moreover, a temperature control program can be stored on the microcontroller, so that the specified operating temperature range can be controlled via the detection of the ambient temperature measurement as an actual value. The operating temperature may be controlled with a deviation of a few degrees Celsius.

The temperature control circuit may be configured to control a specified, e.g., approximately constant operating temperature in a range from 60° C. to 160° C. The semiconductor components can be maintained in the above-mentioned operating temperature range, for example, by thermally insulating the semiconductor components, designed in such a way that the inherent heat loss of the semiconductor components is sufficient for heating and maintaining them in the temperature range. Moreover, the operating temperature range can also be narrower, such as in a range from 90° C. to 110° C. or from 70° C. to 90° C., for example.

The operating temperature range can in particular be determined metrologically or empirically, so that a specified, maximum permissible deviation of the switching voltage threshold, that is to say the so-called threshold voltage, which depends on the semiconductor material and the circuit logic being employed, is not exceeded by a room temperature switching voltage threshold as the nominal switching voltage threshold.

According to one embodiment, the at least one semiconductor component is decoupled from the detector unit. "Thermal decoupling" means that no significant, and in principle negligible, heat input takes place from the heated semiconductor components to the detector unit.

Advantageously, as a result, the smoke ingress into the detector housing, in particular into a smoke detector, is not impaired by convection effects. Otherwise, the heat enveloping the detector unit could impede the smoke ingress or divert it in such a way that in the event of fire, insufficient numbers of smoke particles can reach the inside of the detector unit in order to be detected. The latter may be an optical measuring chamber operating on the scattered light principle or a so-called labyrinth with a large number of smoke inlet openings that are shielded against outside light. The thermal decoupling can be achieved, for example, by a heat-conducting plate or by locating the semiconductor components above the detector unit with, in the latter case the semiconductor components may be connected in a heat-conducting manner to the ceiling for example as the mounting surface to conduct the waste heat.

The detector unit may be mounted so as to be spatially separated from the at least one semiconductor component. In many cases a spatial separation of a few centimeters is adequate, with in this case the ambient air functioning as the thermal insulator. The spatial separation may extend in the vertical direction, with the heated semiconductor components being located above the detector unit, so that the waste heat can be removed upwards by convection or can escape.

According to a further embodiment, the detector unit is configured to detect a physical characteristic, such as the temperature, the smoke density, etc., for example, of the adjacent ambient air. Here, the detector unit is decoupled from the at least one semiconductor component, such as by a thermally insulating bulkhead, a partition or an air baffle, for example.

According to an embodiment, the danger detector has thermal insulation for the at least one semiconductor component. Consequently, on the one hand especially effective thermal decoupling from the detector unit is advantageously achieved. On the other hand, the characteristic values of the thermal insulation, such as the thickness, the dimensions and the thermal conductivity coefficient of an insulating material, for example, can be determined so that the heat dissipated over the surface of the thermal insulation and the inherent heat loss of the thermally insulated semiconductor component are in thermal equilibrium so that, advantageously, the semiconductor components and, if applicable, the other electrical components remain in the specified operating temperature range.

The thermal insulation can be realized, for example, as a capsule of insulating material in which the non-radiation hardened semiconductor components and, if applicable, the other, typically radiation-hardened electrical components are housed. The latter are, for example, passive components such as resistors, coils or capacitors, or electronic components such as semiconductor diodes or transistors having a semiconductor structure pattern in the μm range.

The thermal insulation can also be realized as a half-shell of insulating material, which encloses the typically non-radiation hardened semiconductor components mounted on a circuit carrier, and, if applicable, the other electrical components, from the respective component side.

Furthermore, the thermal insulation can also be realized as an elastic sheet or as foam, which covers in the manner of a passivation the non-radiation hardened semiconductor components and, if applicable, the other electrical components.

Heat-resistant plastics such as polyurethane in the form of rigid foam sheets, for example, are considered as insulating materials for the intended operating temperature range. They can also be foam elastomers, which are based on Neoprene rubber, on EPDM (Ethylene-Propylene-Diene-Monomer) rubber or similar rubber-type base materials. Furthermore, they can be foamed (cellular) glass, for example.

Alternatively or additionally, the thermal insulation can be a vacuum insulation based on the thermos bottle principle. In this case, the non-radiation hardened semiconductor components and, if applicable, the other electrical components can be accommodated in a predominantly evacuated capsule, for example made of metal. The capsule can also be double-walled, the area between the double wall then being largely evacuated or filled with a heat-insulating gas, such as inert gas, for example. The electrical supply leads are then brought out of this capsule in a suitably gas-tight manner.

According to a further embodiment, the danger detector has a housing designed in such a way that the radioactive particle radiation in the nuclear area which strikes the danger detector is essentially screened off. The particle radiation remaining in the nuclear area essentially involves gamma radiation and a small amount of neutron radiation. The housing can be manufactured, for example, from a several millimeters thick plastic housing or from a metal housing such as aluminum for example. The thickness may be in the range from 4 to 10 mm.

BRIEF DESCRIPTION OF THE DRAWINGS

These and other aspects and advantages will become more apparent and more readily appreciated from the following description of the exemplary embodiments, taken in conjunction with the accompanying drawings of which.

DETAILED DESCRIPTION OF THE PREFERRED EMBODIMENT

Figure 1:
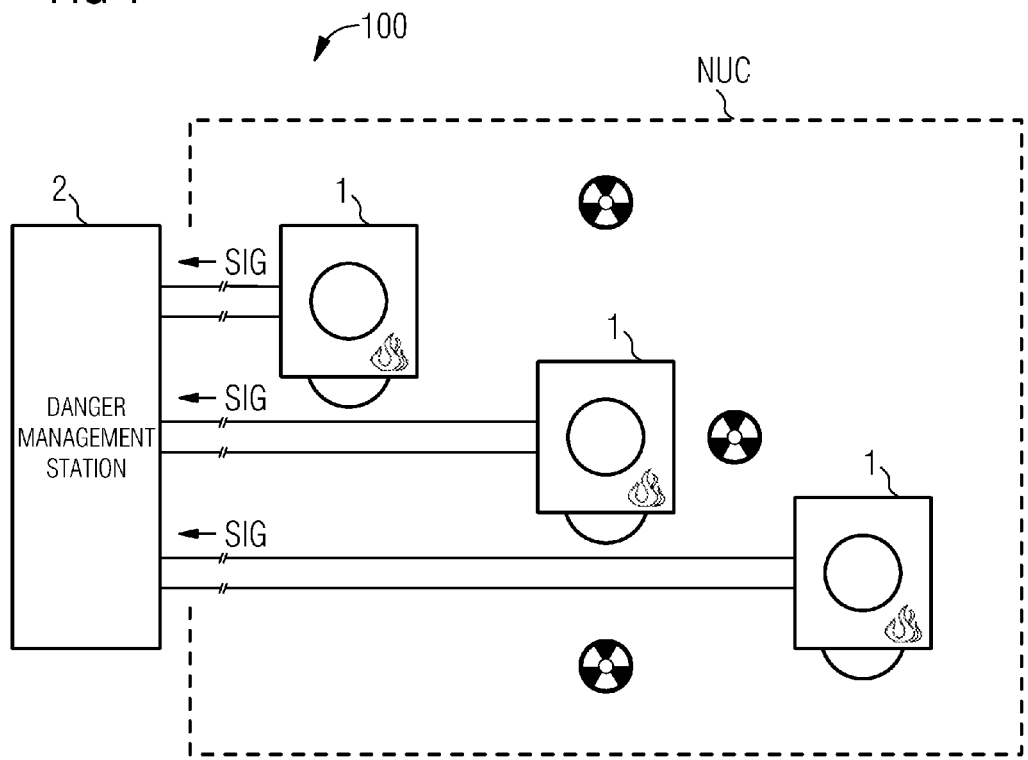
FIG. 1 is block diagram of an example of a danger detector system with a danger management station and with three danger detectors, each connected to the danger management station via a two-wire line, in a nuclear area.

Reference will now be made in detail to the preferred embodiments, examples of which are illustrated in the accompanying drawings, wherein like reference numerals refer to like elements throughout.

FIG. 1 shows an example of a danger detector system 100 with a danger management station 2 and with three danger detectors 1, each connected to the danger management station 2 via a two-wire line known per se, in a nuclear area NUC.

The nuclear area NUC is denoted by three symbols for radioactive radiation. The danger detectors 1 shown can be optical smoke detectors, for example, which have an optical detector unit operating according to the scattered light principle for detecting smoke particles. Alternatively, it can have a temperature detector unit as a heat detector, such as a temperature sensor for fire detection, for example.

Furthermore, it can have a gas sensor as a flue gas detector for detecting typical fire flue gases. Since the danger detectors 1 are distributed at points in an area to be monitored, these can also be described as point detectors.

Furthermore, the danger management station 2 is located outside the nuclear area NUC. In the case where, at least predominantly only fire detectors 1 and in particular only smoke detectors 1 are connected, it can also be described as a CIE (for Control and Indicating Equipment). Since the danger management station 2 is basically not intended for operation in a nuclear area NUC, this has typically only industrial semiconductor components. ST is a detector status that is output in each case by the connected danger detector 1 and is denoted by ST. The detector status ST can be for example a first or a second alarm level, a ready signal or a fault signal. The possible states of such a detector status ST are usually current-modulated in the known manner and transmitted by the connected danger detector 1 to the danger management station 2. The respective detector status ST is ultimately registered by the danger management station 2, which if necessary then outputs an alarm signal, such as to a fire brigade, for example.

Figure 2:
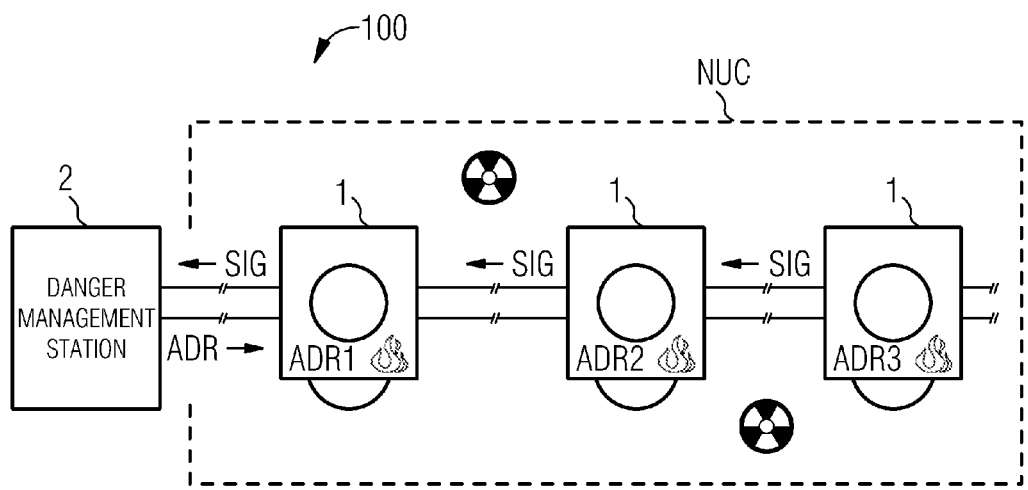
FIG. 2 is block diagram of an example of a further danger detector system with a danger management station and with three addressable danger detectors connected to the danger management station via a common two-wire line, in a nuclear area.

FIG. 2 shows an example of a further danger detector system 100 with a danger management station 2 and with three addressable danger detectors 1 connected via a common two-wire line to the danger management station 2, in a nuclear area NUC.

ADR1-ADR3 denotes a respective selection address which, in the danger detectors 1 shown, has been manually selected. ADR denotes a detector address that is output by the danger management station 2. If this coincides with one of the selection addresses ADR1-ADR3, then the respective danger detector 1 is addressed. In turn, ST denotes the detector status that is output by the addressed danger detector 1, in response to the resulting valid addressing.

In FIG. 1 as well as in FIG. 2, the power supply to the danger detector 1 may be effected by the danger management station 2 via the two-wire lines (not described in further detail). The two-wire line can also be described as a signal bus.

Figure 3:
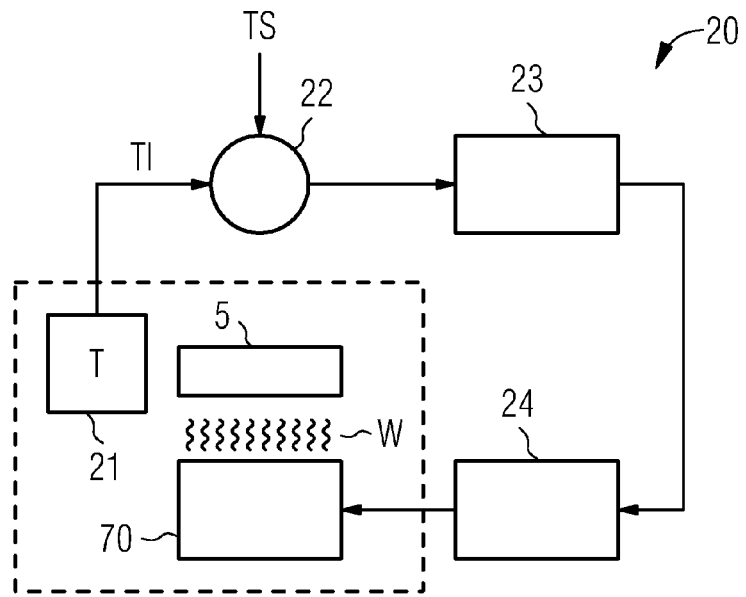
FIG. 3 is block diagram of an example of a temperature control circuit for controlling the temperature of a semiconductor component.

FIG. 3 shows an example of a temperature control circuit 20 for controlling the temperature of a semiconductor component 5. Here the temperature control circuit has a temperature sensor 21 for detecting a temperature actual value TI, a comparator 22 or subtractor for comparing the detected temperature actual value TI with a specified temperature setpoint value TS, a controller 23, to which the determined comparison value is fed as an error deviation, and finally a downstream final controlling element 24 for controlling the electric heating element 70. Here the temperature sensor 21 is located adjacent to the heating element 70 in order to detect the current temperature in the area of the semiconductor component 5 as quickly and as accurately as possible. The reference W symbolizes the thermal radiation which heats up the semiconductor component 5 that is situated above it.

Figure 4:
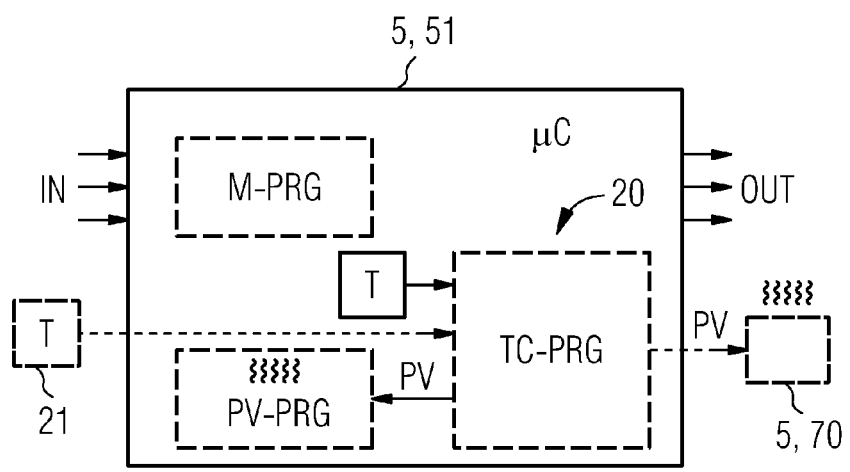
FIG. 4 is block diagram of an example of a temperature control circuit integrated in a microcontroller, as well as for possible control of the inherent electrical power dissipation.

FIG. 4 shows an example of a temperature control circuit 20 integrated in a microcontroller 51 as well as for possible control of the inherent electrical power dissipation.

IN, OUT denote signal inputs and outputs known per se of a microcontroller 20. At least a part of the temperature control circuit 20 is realized as a computer program TC-PRG which can be executed on the microcontroller 51. Moreover, a further computer program PV-PRG which can be executed on the microcontroller 51, is designed to control the electrical power dissipation of the microcontroller 51 in accordance with the recorded temperature of the semiconductor component 5, 51 in terms of the heating system 70. PV denotes a setpoint value for the power dissipation determined by the temperature control circuit 20. Furthermore, M-PRG denotes a control program for carrying out the function of the danger detector. This can result in the detection, evaluation and generation of a danger warning, for example.

As indicated by the broken line in FIG. 4, these parts of the temperature control circuit 20 can also be located outside the microcontroller 51, such as an external temperature sensor 21 shown here. Alternatively or additionally, a further semiconductor component 5 which can be controlled by the microcontroller 52, can be provided to supply a higher electrical heating power if required.

Figure 5:
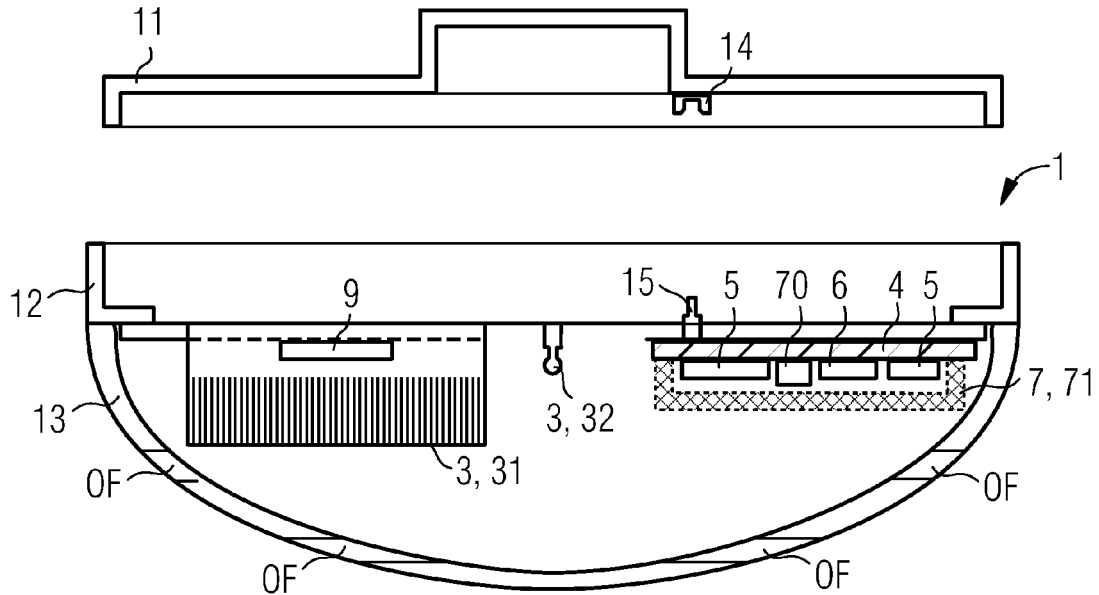
FIG. 5 is a schematic view of an exemplary construction of a danger detector by way of the example of a combined flue gas/heat detector in accordance with a first embodiment.

FIG. 5 shows an exemplary construction of a danger detector 1 by way of an example of a combined flue gas/heat alarm according to a first embodiment.

A detector base 11 to which the actual danger detector 1 can be attached in a detachable manner, can be seen in the upper part of the illustrated figure. The detector base 11 is typically intended for simplified mounting of the danger detector 1. This is usually mounted at a distance from other detector bases 11 on the ceiling of the area to be monitored. At the same time, the detector base 11 is used for the connection to a linear or star-shaped signal bus or for connection to a corresponding two-wire line as shown in FIG. 1 and FIG. 2. In this case the linear signal bus is looped through from one detector base 11 to the next detector base 11, with the respective conductors of the two-wire line being in electrical contact and led to an associated signal contact 14 in the form of a socket, for example. In the attached state of the danger detector 1, in order to make contact with a corresponding mating contact 15 in the form of a plug contact, for example, the signal contact 14 is provided on the detector base 11. The detector base 11 can of course also be an integral part of the danger detector 1 itself.

The lower part of FIG. 5 shows a sectional representation of a danger detector 1. Reference number 12 shows a body and 13 shows a cover of the detector housing 12, 13. In addition, openings OF, through which smoke, flue gas and/or heated air to be detected can reach a corresponding, inner detector unit 3, are provided in the cover 13.

The present example concerns a combined flue gas/heat detector 1 with a flue gas detector unit 31 and a temperature detector unit 32 in the form of a temperature-dependent resistor. The reference number 9 denotes a gas sensor, such as a gas FET for example, that is sensitive to specific combustion gases. The corresponding detector signals are then usually evaluated by an electronic evaluation unit, such as a microcontroller, for example. Based on this evaluation, the microcontroller generates an assigned detector status that is ultimately output on the signal bus, in the form of an alarm signal for example.

The illustrated danger detector 1 is now configured so that the typically non-radiation hardened semiconductor component 5 and, if applicable, further radiation hardened electrical components 6, remain within an operating temperature range from 60° C. to 160° C. In this case the afore the components 5, 6 are located on a circuit carrier 4, as on a printed circuit board, for example. Moreover, the illustrated components 5, 6 are thermally decoupled from the two detector units. In the present example this is achieved by spatial separation from each other. In addition, a partition—not shown in detail—which thermally isolates the two detector units 3 from the printed circuit board 4 with the components 5, 6, can also be embodied in or located in the basic housing 12 or in the cover 13.

In the present example, the components 5, 6 are thermally insulated against the environment by a dome-shaped thermally insulating half-shell 71. This reduces the necessary space for heating the non-radiation hardened semiconductor component 5 to the sealed inner space of the thermally insulating half-shell 71. This prevents a remaining, but possible thermal influence affecting the two detector units 31, 32.

Furthermore, the reference number 70 denotes a heating element in the form of an ohmic resistor, which can be provided for the heating of the components 5, 6 on the printed circuit board 4. This is the case should the inherent electrical power dissipation of the components 5, 6 not be adequate in spite of the thermal insulation 7. This can be the case, for example, when the required operating temperature range compared to the ambient temperature is appreciably higher than the ambient temperature, such as more than 30° C., for example. In this case, the necessary power requirement for heating via the signal bus is advantageously minimized by the thermal insulation 7.

Figure 6:
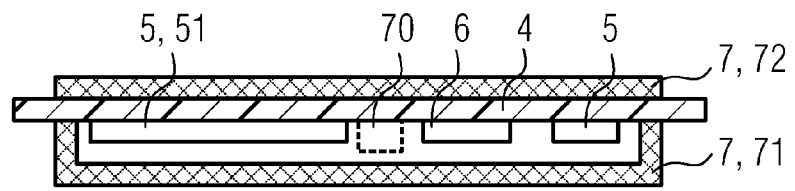
FIG. 6 is a sectional view of a first example of thermal insulation of non-radiation hardened semiconductor components.

FIG. 6 shows a first example of thermal insulation 7 for non-radiation hardened semiconductor components 5. In this case, the thermal insulation 7 may be a thermally insulating half-shell 71 and an opposing thermally insulating plate 72, separated only by the circuit carrier 4. As a result, the degree of thermal insulation with respect to the environment is increased in comparison to the previous embodiment.

Figure 7:
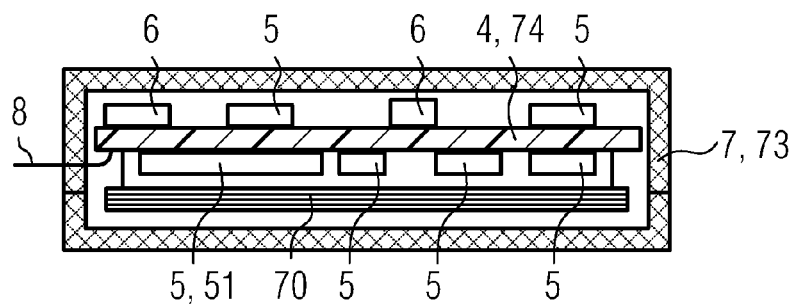
FIG. 7 is a sectional view of a second example of thermal insulation of non-radiation hardened semiconductor components.

FIG. 7 shows a second example of thermal insulation 7 for non-radiation hardened semiconductor components 5. In the present example both sides of the circuit carrier 4 are populated with non-radiation hardened semiconductor components 5 and other electrical components 6. In this case the thermal insulation 7 is realized as a capsule 73, in which the complete circuit carrier 4 together with the components 5, 6 is accommodated. Reference number 8 denotes an electrical connection that is led out of the thermally insulating capsule 73 for the power supply, the signal acquisition, and the signal output. As indicated in the drawing, the illustrated capsule 73 can also be made in two parts for simplified assembly. Compared to the previous embodiment, the degree of thermal insulation with respect to the environment is again increased.

Furthermore, a conductive sheet-type heating element 70 which is supplied electrically via supply contacts—not described in further detail—on the circuit carrier 4, is shown on the circuit carrier 4. Uniform heating of the components 5, 6 is made possible by the 2-dimensional design of the heating element 70. Furthermore, the illustrated danger detector 1 has temperature control, so that by the heating element 70, in particular, the non-radiation hardened semiconductor components 5 remain within the operating temperature range. In the present case this is realized by a microcontroller 51, which at the same time is also a non-radiation hardened semiconductor component 5. The detection of the actual temperature can be realized for example by a temperature sensor already integrated in the microcontroller 51. The electrical, clocked control of an electronic semiconductor switch—not shown—for the power supply for the heating element 70, is likewise realized by the microcontroller 51, based on an executable temperature control computer program stored in the microcontroller.

Figure 8:
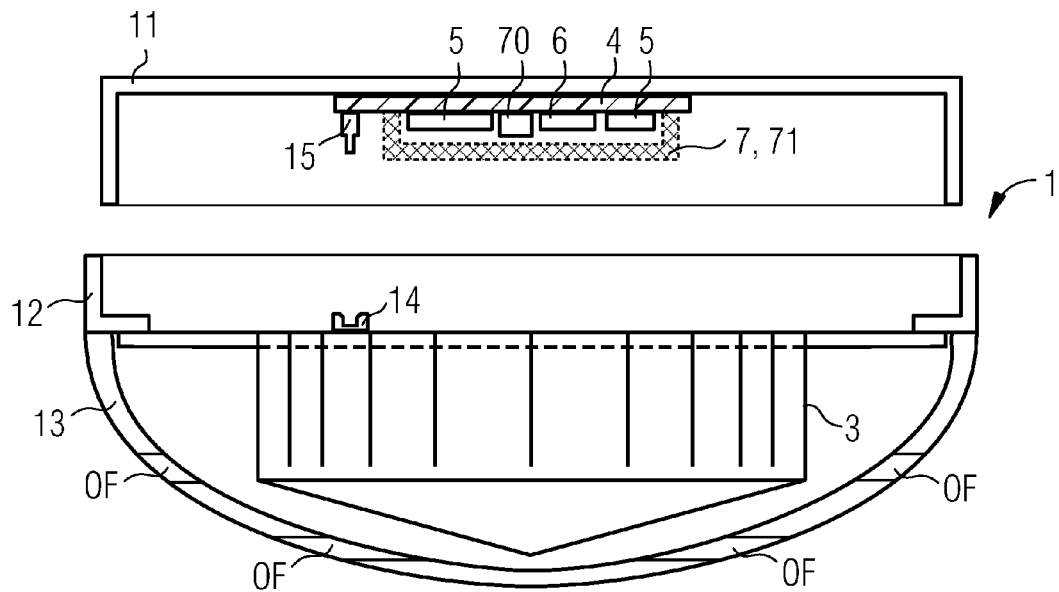
FIG. 8 is a schematic view of an exemplary construction of a danger detector by way of the example of a smoke detector according to a second embodiment.

FIG. 8 shows an exemplary construction of a danger detector 1 in an example of a smoke detector according to a second embodiment. In contrast to the embodiment of FIG. 7, here the entire thermally insulated, heated "electronics" or control unit of the smoke detector 1, that is to say of the circuit carrier 4, the components 5, 6 of the heating element 70 and the thermally insulating half-shell 71, are located in the detector base 11. The electrical connection to the power supply, to the control and to the signal acquisition of the optoelectronic components—not shown—in the smoke detector unit 3 is again made to the detector base 11 via the electrical contacts 14, 15 in the assembled state of the smoke detector 1. In the present example the thermal decoupling of the circuit carrier 4 with the components 5, 6, 70, from the detector unit 3 is achieved by the spatially separated vertical arrangement between them. The hatched border of the thermal insulation 7 or thermal insulation unit is intended to indicate that such an arrangement is not necessary in every case.

Figure 9:
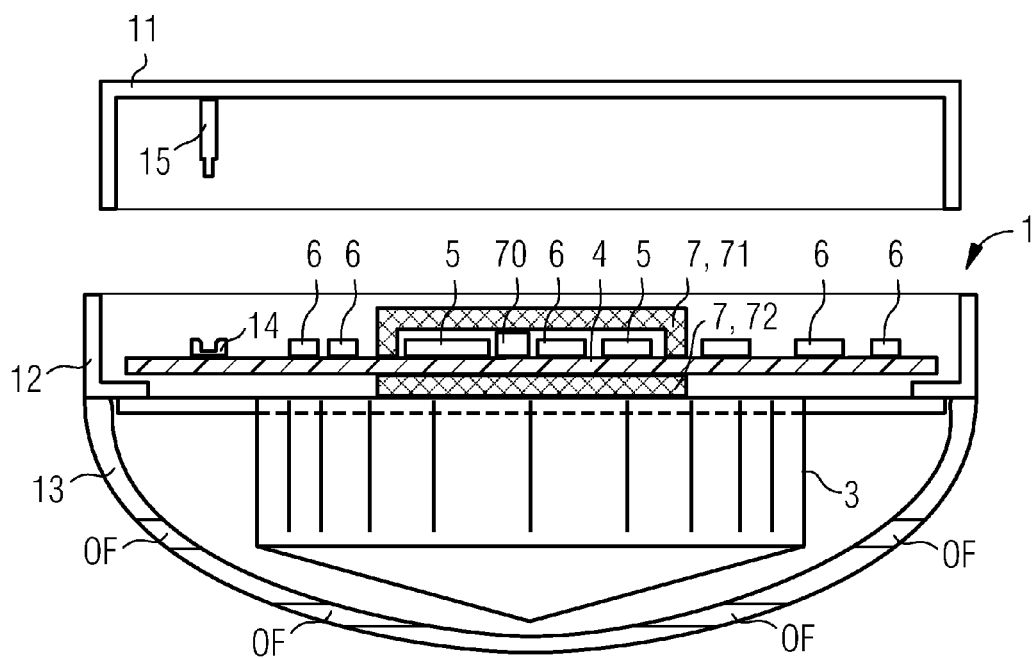
FIG. 9 is a schematic view of an exemplary construction of a danger detector by way of the example of a smoke detector according to a third embodiment.

FIG. 9 shows an exemplary construction of a danger detector 1 in an example of a smoke detector according to a third embodiment.

In contrast to the embodiment of FIG. 8, here the spatially separated vertical arrangement of the entire, fully thermally insulated, heated "electronics" is realized by the detector unit 3 in the smoke detector 1 itself. In addition, for improved thermal decoupling, the thermally insulated components 5, 6 are located on the component side of the circuit carrier 4 facing the detector base 11. Consequently, the residual heat is advantageously removed from the thermal insulation 7 upwards to the outside and then over the typically cold ceiling area by convection, so that unfavorable thermal coupling of the residual heat to the detector unit 3 can be virtually eliminated.

Figure 10:
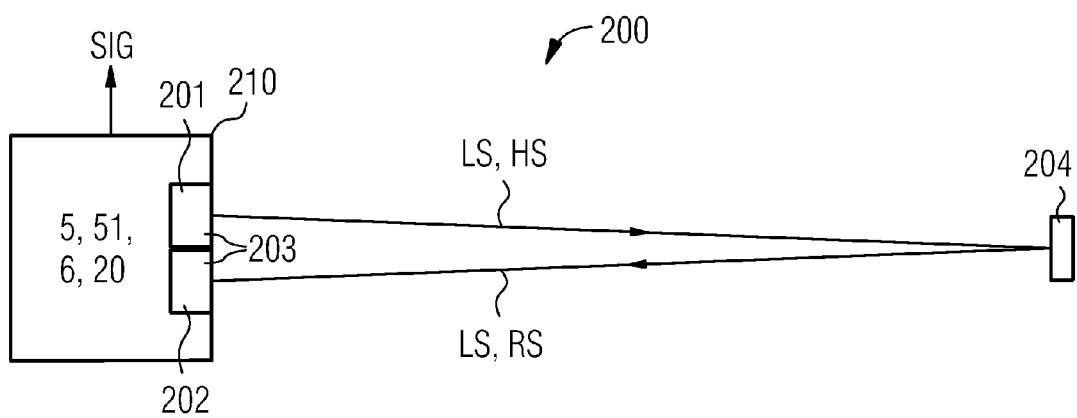
FIG. 10 is block diagram of an example of a danger detector embodied as a linear smoke detector, with a reflecting unit and a smoke detector unit.

FIG. 10 shows an example of a danger detector 1 embodied as a linear smoke detector 200, with a reflecting unit 204 and a smoke detector unit 210.

In the present example the smoke detector unit 210, which is typically constructed as a module, and the reflecting unit 204, are located opposite each other. The smoke detector unit 210 includes detector unit 203 for detecting the at least one danger characteristic. The latter is typically a minimum smoke density or a minimum smoke particle density. For its part, the detector unit 203 includes a light transmitter 201 for emitting a light beam LS which traverses a measured distance, and an adjacent light receiver 202 for receiving the emitted light beam LS at the end of the measured distance. The light transmitter 201 may emit highly collimated infrared light, by an IR laser or an IR light emitting diode, for example. The light receiver 202 is sensitive to the light to be received. It is an IR photodiode or an IR photo transistor, for example. In the present case, the reflecting unit 204 is a reflecting prism. Alternatively, it can be a mirror or a so-called retroreflector, as in a "cat's eye". Here the reflecting unit 204 is provided to reflect the light beam LS emitted by the light transmitter 201 back to the light receiver 202.

In the present example the light beam LS includes a forward beam HS and a return beam RS, which run approximately antiparallel to each other. Here the measured distance over which the light beam LS passes is made up of the length of the forward beam HS and the length of the return beam RS, that is to say double the distance between the smoke detector unit 210 and the reflecting unit 204. Furthermore, the smoke detector unit 210 has the at least one semiconductor component 5 and the other electrical components 6 at least for outputting the alarm signal SIG. Here the smoke detector unit also has the temperature control circuit 20, which is configured to control the temperature of the at least one semiconductor component 5, in particular to a specified, approximately constant operating temperature in a range from 60° C. to 160° C.

Consequently, compared to the related art, it is possible to employ the linear smoke detector 200 for a longer period in the area with increased radioactive radiation disposition, such as in the so-called exclusion area NUC of a nuclear reactor in a nuclear power station.

Alternatively—not shown in any figure—the light transmitter and the light receiver can also be spatially separated from each other. In this case also, no reflecting unit is required. The light transmitter is then located in place of the illustrated reflecting unit and aligned with the opposite light receiver. In this case the distance between the light transmitter and the light receiver likewise corresponds to the measured distance.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV,* 358 F3d 870, 69 USPQ2d 1865 (Fed. Cir. 2004).

What is claimed is:

1. A danger detector, comprising:
   at least one detector unit detecting at least one danger characteristic;
   at least one semiconductor component and other electrical components at least for outputting an alarm signal; and
   a temperature control circuit configured to control temperature of the at least one semiconductor component that is configured to operate in an area with increased radioactive radiation disposition.

2. The danger detector as claimed in claim 1, wherein the temperature control circuit comprises an electrical heating element controlling heating of the at least one semiconductor component.

3. The danger detector as claimed in claim 2, wherein the at least one semiconductor component includes a processor-backed microcontroller having at least one computer program executable thereon to control electrical power dissipation of the microcontroller and/or at least one other semiconductor component which can be controlled by the microcontroller in accordance with the temperature of the semiconductor component by way of the electrical heating element.

4. The danger detector as claimed in claim 3, wherein the temperature control circuit is configured to control the temperature of the at least one semiconductor component to a substantially constant operating temperature in a range from 60° C. to 160° C.

5. The danger detector as claimed in claim 3, wherein the at least one semiconductor component is thermally decoupled from the at least one detector unit.

6. The danger detector as claimed in claim 3, further comprising:
   a thermal insulation at least for the at least one semiconductor component.

7. The danger detector as claimed in claim 3, wherein the danger detector is embodied as a smoke detector.

8. The danger detector as claimed in claim 2, wherein the temperature control circuit is configured to control the temperature of the at least one semiconductor component to a substantially constant operating temperature in a range from 60° C. to 160° C.

9. The danger detector as claimed in claim 2, wherein the at least one semiconductor component is thermally decoupled from the at least one detector unit.

10. The danger detector as claimed in claim 2, further comprising:
    a thermal insulation at least for the at least one semiconductor component.

11. The danger detector as claimed in claim 2, wherein the danger detector is embodied as a smoke detector.

12. The danger detector as claimed in claim 1, further comprising:
    a thermal insulation at least for the at least one semiconductor component.

13. The danger detector as claimed in claim 1, further comprising:
    a housing designed so that in the area with increased radioactive radiation, radioactive particle radiation striking the danger detector is substantially screened off.

14. The danger detector as claimed in claim 1, further comprising:
    at least one light reflecting unit; and
    a smoke detector unit including:
       the detector unit having a light transmitter emitting a light beam which traverses a measured distance to the at least one light reflecting unit, and a light receiver receiving the light beam at the end of the measured distance after reflection from the at least one reflecting unit, and
       the at least one semiconductor component and the other electrical components at least for outputting the alarm signal.

15. The danger detector as claimed in claim 1, wherein the temperature control circuit is configured to control the temperature of the at least one semiconductor component to a substantially constant operating temperature in a range from 60° C. to 160° C.

16. The danger detector as claimed in claim 15, further comprising thermal insulation at least for the at least one semiconductor component.

17. The danger detector as claimed in claim 15, wherein the danger detector is embodied as a smoke detector.

18. The danger detector as claimed in claim 1, wherein the at least one semiconductor component is thermally decoupled from the at least one detector unit.

19. The danger detector as claimed in claim 1, wherein the at least one semiconductor component includes a processor-backed microcontroller having at least one computer program executable thereon to control electrical power dissipation of the microcontroller and/or at least one other semiconductor component which can be controlled by the microcontroller in accordance with the temperature of the semiconductor component by way of the electrical heating element.

20. The danger detector as claimed in claim 1, wherein the danger detector is embodied as a smoke detector.

* * * * *